(12) United States Patent
Lee

(10) Patent No.: US 6,846,705 B2
(45) Date of Patent: Jan. 25, 2005

(54) METHOD FOR FABRICATING COMPLEMENTARY METAL OXIDE SEMICONDUCTOR IMAGE SENSOR HAVING REDUNDANCY MODULE

(75) Inventor: Won-Ho Lee, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/744,341

(22) Filed: Dec. 22, 2003

(65) Prior Publication Data

US 2004/0219707 A1 Nov. 4, 2004

(30) Foreign Application Priority Data

Apr. 29, 2003 (KR) .............................. 10-2003-0026893

(51) Int. Cl.[7] .............................................. H01L 21/82
(52) U.S. Cl. ..................................................... 438/132
(58) Field of Search ............................... 438/128–132, 438/601, 622, 254; 257/529

(56) References Cited

U.S. PATENT DOCUMENTS

| | | | | |
|---|---|---|---|---|
| 5,736,433 A | * | 4/1998 | Bryant et al. ............... | 438/130 |
| 6,008,075 A | * | 12/1999 | Lien et al. .................. | 438/132 |
| 6,235,557 B1 | * | 5/2001 | Manley ....................... | 438/132 |
| 6,348,398 B1 | * | 2/2002 | Wang .......................... | 438/601 |
| 6,448,113 B2 | * | 9/2002 | Lee et al. .................... | 438/132 |
| 6,518,643 B2 | * | 2/2003 | McDevitt et al. ............ | 257/529 |
| 2003/0045087 A1 | * | 3/2003 | Yoshie et al. ............... | 438/622 |
| 2003/0060009 A1 | * | 3/2003 | Cheng et al. ................ | 438/254 |
| 2004/0092091 A1 | * | 5/2004 | Yang et al. .................. | 438/601 |

* cited by examiner

*Primary Examiner*—Savitri Mulpuri
(74) *Attorney, Agent, or Firm*—Blakely Sokoloff Taylor & Zafman

(57) ABSTRACT

The present invention relates to a method for fabricating a complementary metal oxide semiconductor (CMOS) image sensor having a redundancy module. The method includes the steps of: forming a semiconductor substrate structure including a fuse and a pad deposited respectively in a redundancy region and a pad region of a substrate and a passivation layer deposited over the semiconductor substrate structure; etching a portion of the passivation layer disposed above the pad to open the pad and simultaneously etching another portion of the passivation layer disposed above the fuse and a partial portion of the insulation layer with use of a photoresist pattern as an etch mask; forming an over coating layer (OCL) pattern on the photoresist, the OCL pattern masking the pad; etching the exposed partial portion of the insulation layer with use of the photoresist pattern as an etch mask to open and then cut the fuse; and removing the OCL pattern and the photoresist pattern.

3 Claims, 3 Drawing Sheets

METHOD FOR FABRICATING COMPLEMENTARY METAL OXIDE SEMICONDUCTOR IMAGE SENSOR HAVING REDUNDANCY MODULE

FIELD OF THE INVENTION

The present invention relates to a method for fabricating a complementary metal oxide semiconductor (CMOS) image sensor; and, more particularly, to a method for fabricating a CMOS image sensor having a redundancy module.

DESCRIPTION OF RELATED ARTS

Generally, a complementary metal oxide semiconductor (CMOS) image sensor is a semiconductor device that converts an optical image into an electric signal. The CMOS image sensor includes a photo-detection unit for detecting a light and a logic circuit for processing the detected light into an electric signal, which is, in turn, converted into a corresponding datum. The CMOS technology adopts a switching mode, wherein outputs are sequentially detected by using MOS transistors made with the same number as that of pixels.

Also, there have been made various attempts to improve photosensitivity by increasing a fill factor, which is a ratio of an area of a photosensitive portion with respect to the total area of the CMOS image sensor. However, such attempt is still limited since the logic circuit cannot be fundamentally eliminated. Therefore, a light collection technology for changing paths of lights incident to areas other than the photo-detection unit and collecting these lights is introduced to improve the light sensitivity. This light collection technology is related to a technology for fabricating a microlens. Also, in an image sensor for realizing color images, there is an array of color filters (hereinafter referred to as a color filter array (CFA)) on an upper part of the photo-detection unit for generating and storing photoelectric charges. Particularly, the CFA generally includes three color filters of red, green and blue.

Meanwhile, as the number of pixels in the CMOS image sensor is increased, the number of defective pixels is also increased due to problems related to fabrication processes. Thus, a redundancy module having a fuse for use in repair is installed within the CMOS image sensor in order to compensate the defective pixels.

Figure 1A:
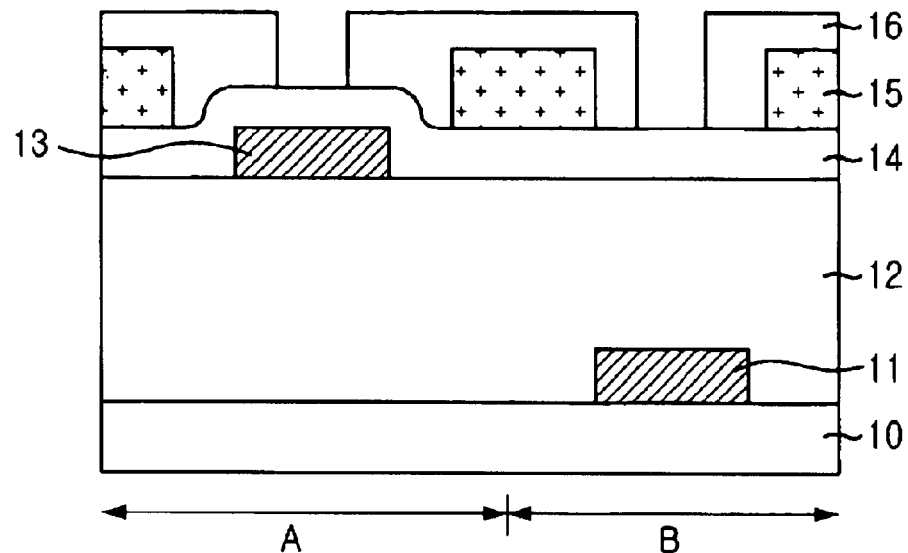
Figure 1B:
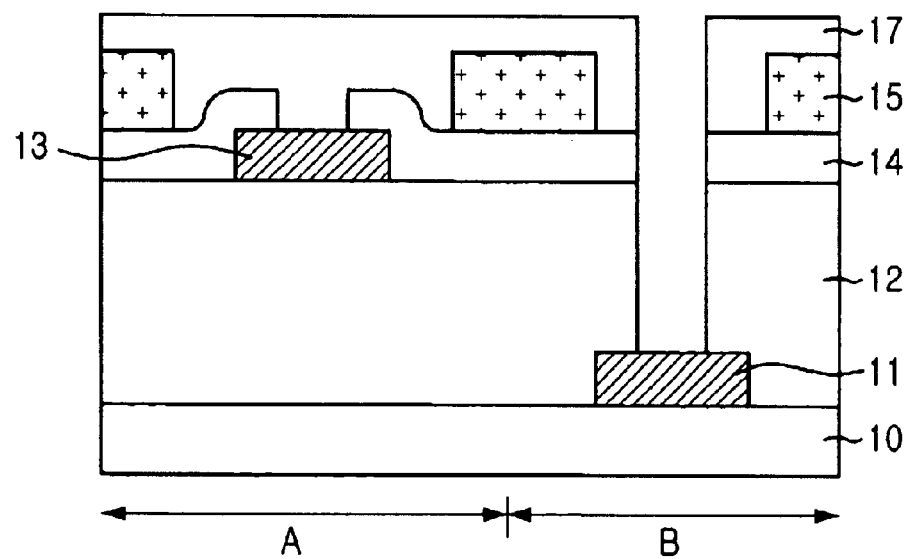

FIGS. 1A and 1B are cross-sectional views illustrating a conventional method for fabricating a CMOS image sensor having a redundancy module.

Referring to FIG. 1A, a substrate 10 is defined with a pad region A and a redundancy region B. A fuse is formed in the redundancy region B, and an insulation layer 12 is formed on the above substrate structure. In the pad region A, a pad 13 is formed on the insulation layer 12. Afterwards, a passivation layer 14 is formed such that it covers the pad 13 and the insulation layer 12. Herein, the passivation layer 14 is formed by stacking an oxide layer and a nitride layer. Although not illustrated, a CFA is formed in a pixel region. An over coating layer (OCL), which is a material for use in a photoresist, is coated as a planarization layer on an entire surface of the resulting structure including the passivation layer 14. Then, with use of an OCL mask, a photo-exposure and developing process is performed to form an OCL pattern 15 exposing the pad 13, the fuse 11 and predetermined portions of the passivation layer 14. Next, a first photoresist layer is coated over the above resulting structure such that the first photoresist layer covers the OCL pattern 15, and then, the first photoresist layer is subjected to a photo-exposure and developing process with use of a pad mask. From this photo-exposure and developing process, a first photoresist pattern 16 exposing portions of the passivation layer 14 disposed above the pad 13 and the fuse 11 is formed.

Referring to FIG. 1B, the passivation layer 14 is etched with use of the first photoresist pattern 16 as an etch mask to thereby open the pad 13 and simultaneously to expose a portion of the insulation layer 12 disposed above the fuse 11. The photoresist pattern 16 is then removed by the known method. Thereafter, a second photoresist layer is coated on the above resulting structure such that the second photoresist layer covers the OCL pattern 15. Then, a photo-exposure and developing process is performed with use of a fuse mask to thereby expose a surface of the fuse 11. Next, the exposed portion of the insulation layer 12 is etched with use of the second photoresist pattern 17 as an etch mask to open the fuse 11. Although not illustrated, the fuse 11 is cut thereafter.

In the above described method, for testing the redundancy module, three different masks are used to open the pad and the fuse. Thus, the coating, photo-exposure and developing processes are required to be performed at least three times. As a result, the overall fabrication process may become complicated. Also, manufacturing costs may increase.

SUMMARY OF THE INVENTION

It is, therefore, an object of the present invention to provide a method for fabricating a complementary metal oxide semiconductor (CMOS) image sensor with a simplified fabrication process and a reduced manufacturing cost by decreasing the number of masks used for opening a pad and a fuse.

In accordance with an aspect of the present invention, there is provided a method for fabricating a complementary metal oxide semiconductor (CMOS) image sensor, including the steps of: forming a semiconductor substrate structure including a fuse and a pad deposited respectively in a redundancy region and a pad region of a substrate and a passivation layer deposited over the semiconductor substrate structure; etching a portion of the passivation layer disposed above the pad to open the pad and simultaneously etching another portion of the passivation layer disposed above the fuse and a partial portion of the insulation layer with use of a photoresist pattern as an etch mask; forming an over coating layer (OCL) pattern on the photoresist, the OCL pattern masking the pad; etching the exposed partial portion of the insulation layer with use of the photoresist pattern as an etch mask to open and then cut the fuse; and removing the OCL pattern and the photoresist pattern.

In accordance with another aspect of the present invention, there is provided a method for fabricating a CMOS image sensor, including the steps of: forming a semiconductor substrate structure including a fuse and a pad deposited respectively in a redundancy region and a pad region and a passivation layer on the semiconductor substrate structure; forming a first OCL pattern exposing a portion of the passivation layer disposed above the fuse but masking the pad on a photoresist pattern; etching the exposed portion of the passivation layer and a partial portion of the insulation layer with use of the first OCL pattern and the photoresist pattern as an etch mask to thereby open and cut the fuse; removing the first OCL pattern; forming a second OCL pattern exposing a portion of the passivation layer disposed above the pad but masking the fuse on the photoresist pattern; etching the exposed portion of the passivation layer with use of the second OCL pattern and the photoresist pattern as an etch mask to thereby open the pad; and removing the second OCL pattern and the photoresist pattern.

BRIEF DESCRIPTION OF THE DRAWING(S)

Figure 2A:
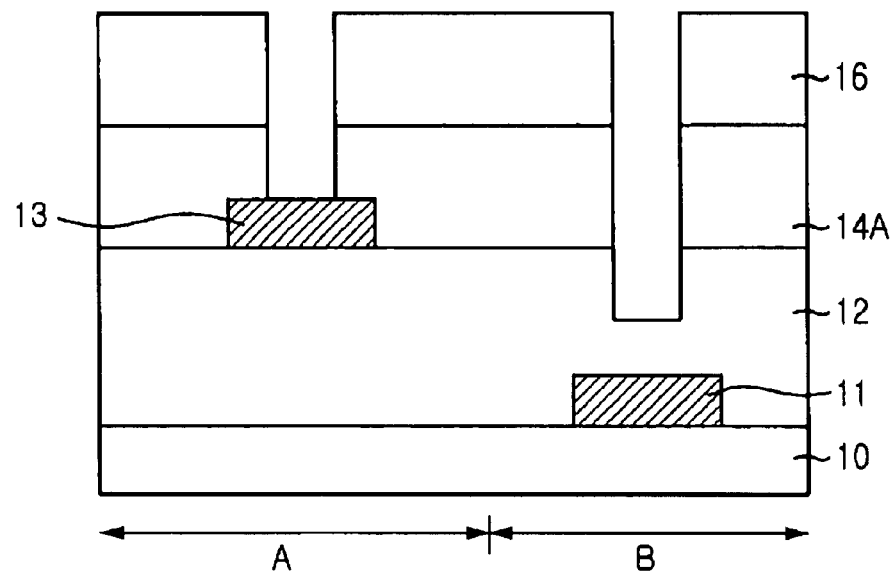
Figure 2B:
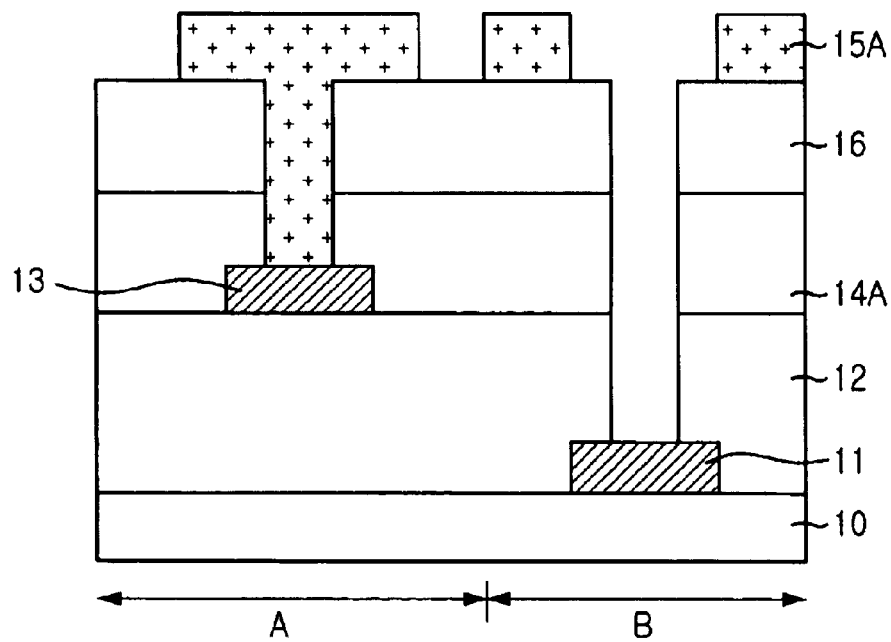
Figure 2C:
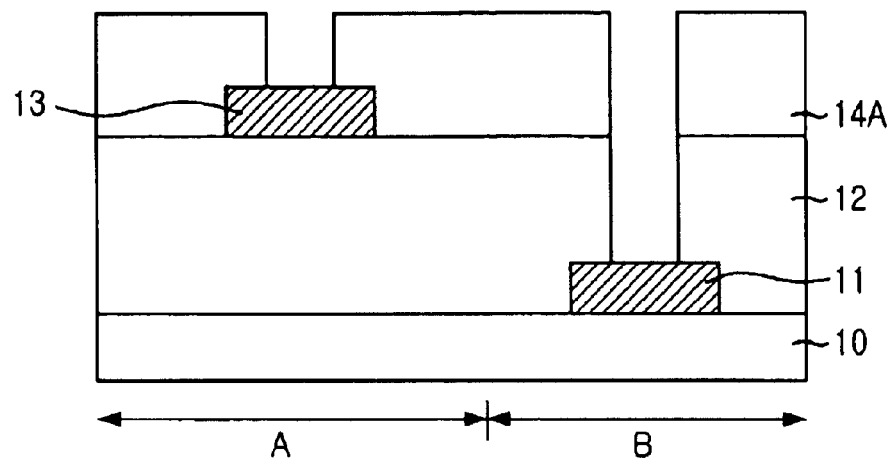

The above and other objects and features of the present invention will become apparent from the following description of the preferred embodiments given in conjunction with the accompanying drawings, in which:

FIGS. 1A and 1B are cross-sectional views illustrating a conventional method for fabricating a complementary metal oxide semiconductor (CMOS) image sensor having a redundancy module; and FIGS. 2A to 2C are cross-sectional views illustrating a method for fabricating a CMOS image sensor having a redundancy module in accordance with a preferred embodiment of the present invention.

DETAILED DESCRIPTION OF THE INVENTION

Hereinafter, detailed descriptions on a preferred embodiment of the present invention will be provided with reference to the accompanying drawings.

FIGS. 2A to 2C are cross-sectional views illustrating a method for fabricating a CMOS image sensor having a redundancy module in accordance with a preferred embodiment of the present invention.

Referring to FIG. 2A, a substrate 10 is defined with a pad region A and a redundancy region B. In the redundancy region B, a fuse 11 is formed. Then, an insulation layer 12 is deposited on an entire surface of the above substrate structure. A pad 13 is formed on the insulation layer disposed in the pad region A. Afterwards, a passivation layer 14A is formed with a thick thickness to serve as a planarization layer and cover the pad 13. Herein, the passivation layer 14A is formed by stacking an undoped silicate glass (USG) layer and a plasma enhanced (PE)-nitride layer or by stacking an USG layer and an oxynitride layer. Then, a first photoresist layer is coated on the passivation layer 14A. The first photoresist layer is subjected to a photo-exposure and developing process with use of a pad mask to form a photoresist pattern 16 exposing a first and a second predetermined portions of the passivation layer disposed above the pad 13 and the fuse 11, respectively. Thereafter, the exposed first portion of the passivation layer 14A are etched with use of the photoresist pattern 16 as an etch mask to open a surface of the pad 13. Simultaneously, the second portion of the passivation layer 14A and a partial portion of the insulation layer 12 are etched with use of the photoresist pattern 16 as an etch mask.

Referring to FIG. 2B, an over coating layer (OCL) is coated on the above resulting structure and is then patterned through the use of an OCL mask and a positive photoresist. From this patterning, an OCL pattern 15A opening the partial portion of the insulation layer 12 disposed above the fuse 11 but masking the pad 13 and regions around the pad 13 is formed. Next, the exposed portion of the insulation layer 12 is etched with use of the OCL pattern 15A and the first photoresist pattern 16 as an etch mask to thereby open the fuse 11. Although not illustrated, the fuse 11 is cut thereafter. At this time, since the OCL pattern 15A protects the pad 13, a problem such like damages to the pad 13 does not occur. Thus, it is possible to stably repair a laser.

Referring to FIG. 2C, the pad 13 is opened again by removing the OCL pattern 15A and the photoresist pattern 16.

In addition to the above described preferred embodiment, another preferred embodiment is still possible. After the formation of the passivation layer 14A and the photoresist pattern 16, the OCL pattern 15A is formed. That is, the OCL pattern 15A is formed before opening the pad 13. The fuse 11 is then opened and cut, and the OCL pattern 15A is removed thereafter. Another OCL pattern opening the pad but masking the fuse is formed by using the OCL mask and a negative photoresist, and then, the pad 13 is opened. On the basis of this preferred embodiment, it is possible to independently control the openings of the pad and the fuse.

In accordance with the first provided preferred embodiment of the present invention, the photoresist pattern opens the pad with use of the pad mask, and the fuse is opened and cut under a state that the pad is masked by the OCL pattern. Therefore, unlike the conventional method, the fuse mask is not necessary and a series of processes for forming the photoresist pattern related to the fuse mask, i.e., a coating process and a photo-exposure and developing process, can be omitted. This effect results in a simplified fabrication process and a decrease in manufacturing costs. Also, the OCL pattern protects the pad during the opening and cutting of the fuse, and thus, it is further possible to stably repair the laser.

While the present invention has been described with respect to certain preferred embodiments, it will be apparent to those skilled in the art that various changes and modifications may be made without departing from the scope of the invention as defined in the following claims.

What is claimed is:

1. A method for fabricating a complementary metal oxide semiconductor (CMOS) image sensor, comprising the steps of:

forming a semiconductor substrate structure including a fuse and a pad deposited respectively in a redundancy region and a pad region of a substrate and a passivation layer deposited over the semiconductor substrate structure, wherein the pad is insulated from the fuse by an insulation layer;

etching a portion of the passivation layer disposed above the pad to open the pad and simultaneously etching another portion of the passivation layer and a partial portion of the insulation layer disposed above the fuse with use of a photoresist pattern as an etch mask;

forming an over coating layer (OCL) pattern on the photoresist, the OCL pattern masking the pad;

etching the exposed partial portion of the insulation layer with use of the photoresist pattern as an etch mask to open and then cut the fuse; and removing the OCL pattern and the photoresist pattern.

2. The method as recited in claim 1, wherein the passivation layer is formed by stacking an undoped silicate glass (USG) layer and a plasma enhanced nitride layer or by stacking an USG layer and an oxynitride layer.

3. The method as recited in claim 1, wherein the OCL pattern is formed by using an OCL mask and a positive photoresist.

* * * * *